United States Patent
Khlat et al.

(10) Patent No.: US 11,117,799 B2
(45) Date of Patent: Sep. 14, 2021

(54) WIRE-BASED MICROELECTROMECHANICAL SYSTEMS (MEMS) APPARATUS

(71) Applicant: Qorvo US, Inc., Greensboro, NC (US)

(72) Inventors: Nadim Khlat, Cugnaux (FR); Robert Aigner, Ocoee, FL (US)

(73) Assignee: Qorvo US, Inc., Greensboro, NC (US)

( * ) Notice: Subject to any disclaimer, the term of this patent is extended or adjusted under 35 U.S.C. 154(b) by 97 days.

(21) Appl. No.: 16/720,919

(22) Filed: Dec. 19, 2019

(65) Prior Publication Data

US 2020/0317507 A1    Oct. 8, 2020

Related U.S. Application Data

(60) Provisional application No. 62/828,227, filed on Apr. 2, 2019.

(51) Int. Cl.
*B81B 7/00* (2006.01)
*B81B 7/02* (2006.01)

(52) U.S. Cl.
CPC ............ *B81B 7/008* (2013.01); *B81B 7/0006* (2013.01); *B81B 7/02* (2013.01)

(58) Field of Classification Search
None
See application file for complete search history.

(56) References Cited

U.S. PATENT DOCUMENTS

| | | | |
|---|---|---|---|
| 10,453,636 B1 * | 10/2019 | Khlat | H03H 9/02007 |
| 2016/0191092 A1 * | 6/2016 | Liao | H04B 1/1036 455/307 |

* cited by examiner

*Primary Examiner* — Benjamin P Sandvik
(74) *Attorney, Agent, or Firm* — Withrow & Terranova, PLLC (57) ABSTRACT

A wire-based microelectromechanical systems (MEMS) apparatus is provided. In examples discussed herein, the wire-based MEMS apparatus includes a MEMS control bus and at least one passive MEMS switch circuit. The passive MEMS switch circuit is configured to close a MEMS switch(es) by generating a constant voltage(s) that exceeds a defined threshold voltage (e.g., 30-50 V). In a non-limiting example, the passive MEMS switch circuit can generate the constant voltage(s) based on a radio frequency (RF) voltage(s), which may be harvested from an RF signal(s) received via the MEMS control bus. In this regard, it may be possible to eliminate active components and/or circuits from the passive MEMS switch circuit, thus helping to reduce leakage and power consumption. As a result, it may be possible to provide the passive MEMS switch circuit in a low power apparatus for supporting such applications as the Internet-of-Things (IoT).

20 Claims, 4 Drawing Sheets

WIRE-BASED MICROELECTROMECHANICAL SYSTEMS (MEMS) APPARATUS

RELATED APPLICATIONS

This application claims the benefit of U.S. provisional patent application Ser. No. 62/828,227, filed on Apr. 2, 2019, the disclosure of which is incorporated herein by reference in its entirety.

FIELD OF THE DISCLOSURE

The technology of the disclosure relates generally to operating microelectromechanical systems (MEMS) switches in an electrical circuit.

BACKGROUND

Wireless devices have become increasingly common in current society. The prevalence of these wireless devices is driven in part by the many functions that are now enabled on such devices for supporting a variety of applications. In this regard, a wireless device may employ a variety of circuits and/or components (e.g., filters, transceivers, antennas, and so on) to support different numbers and/or types of applications. Accordingly, the wireless device may include a number of switches to enable dynamic and flexible couplings between the variety of circuits and/or components.

Notably, a conventional switch, such as a silicon-on-insulator (SOI) switch, may create a relatively higher on-resistance ($R_{ON}$) when the conventional switch is closed and a relatively higher off-capacitance ($C_{OFF}$) when the conventional switch is opened. Accordingly, the conventional switch may suffer a degraded figure-of-merit (FOM) (FOM=$R_{ON} \times C_{OFF}$) and cause unwanted insertion loss to degrade RF efficiency and/or performance of the wireless device. In contrast, a microelectromechanical systems (MEMS) switch typically has a FOM that is at least ⅓ lower than the FOM of the conventional SOI switch. As a result, it may be possible to reduce the unwanted insertion loss associated with the conventional SOI switch by replacing the conventional SOI switch with the MEMS switch, thus helping to improve RF efficiency and/or performance of the wireless device.

SUMMARY

Aspects disclosed in the detailed description include a wire-based microelectromechanical systems (MEMS) apparatus. In examples discussed herein, the wire-based MEMS apparatus includes a MEMS control bus and at least one passive MEMS switch circuit. The passive MEMS switch circuit is configured to close a MEMS switch(es) by generating a constant voltage(s) that exceeds a defined threshold voltage (e.g., 30-50 V). In a non-limiting example, the passive MEMS switch circuit can generate the constant voltage(s) based on a radio frequency (RF) voltage(s), which may be harvested from an RF signal(s) received via the MEMS control bus. In this regard, it may be possible to eliminate active components and/or circuits from the passive MEMS switch circuit, thus helping to reduce leakage and power consumption. As a result, it may be possible to provide the passive MEMS switch circuit in a low power apparatus for supporting such applications as the Internet-of-Things (IoT).

In one aspect, a wire-based MEMS apparatus is provided. The wire-based MEMS apparatus includes a MEMS control bus configured to communicate an RF signal modulated to provide an RF voltage in at least one frequency bandwidth. The wire-based MEMS apparatus also includes at least one passive MEMS switch circuit coupled to the MEMS control bus. The passive MEMS switch circuit includes a voltage circuit corresponding to the at least one frequency bandwidth and configured to generate a constant voltage based on the RF voltage. The passive MEMS switch circuit also includes a MEMS switch coupled to the voltage circuit and configured to be closed in response to receiving the constant voltage exceeding a defined threshold voltage.

In another aspect, a wire-based MEMS apparatus is provided. The wire-based MEMS apparatus includes a MEMS control bus configured to communicate an RF signal modulated to provide an RF voltage in at least one frequency bandwidth. The wire-based MEMS apparatus also includes a MEMS control circuit coupled to the MEMS control bus. The MEMS control circuit is configured to modulate the RF signal to provide the RF voltage in the at least one frequency bandwidth. The MEMS control circuit is also configured to communicate the RF signal via the MEMS control bus. The wire-based MEMS apparatus also includes at least one passive MEMS switch circuit coupled to the MEMS control bus. The passive MEMS switch circuit includes a voltage circuit corresponding to the at least one frequency bandwidth and configured to generate a constant voltage based on the RF voltage. The passive MEMS switch circuit also includes a MEMS switch coupled to the voltage circuit and configured to be closed in response to receiving the constant voltage exceeding a defined threshold voltage.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure and, together with the description, serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include a wire-based microelectromechanical systems (MEMS) apparatus. In examples discussed herein, the wire-based MEMS apparatus includes a MEMS control bus and at least one passive MEMS switch circuit. The passive MEMS switch circuit is configured to close a MEMS switch(es) by generating a constant voltage(s) that exceeds a defined threshold voltage (e.g., 30-50 V). In a non-limiting example, the passive MEMS switch circuit can generate the constant voltage(s) based on a radio frequency (RF) voltage(s), which may be harvested from an RF signal(s) received via the MEMS control bus. In this regard, it may be possible to eliminate active components and/or circuits from the passive MEMS switch circuit, thus helping to reduce leakage and power consumption. As a result, it may be possible to provide the passive MEMS switch circuit in a low power apparatus for supporting such applications as the Internet-of-Things (IoT).

Figure 1A:
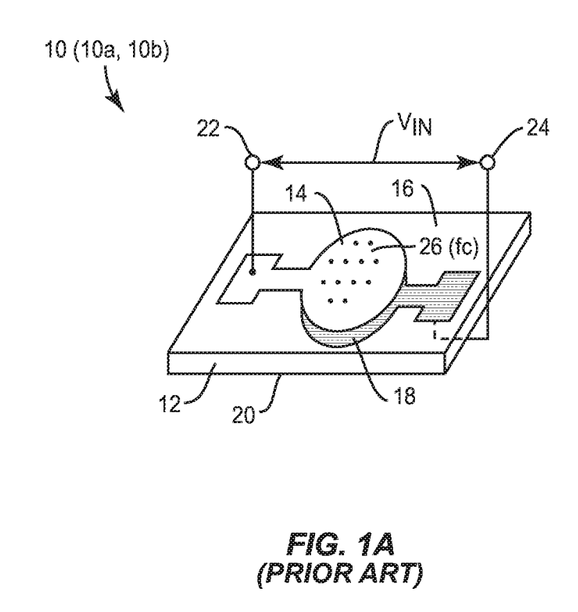
FIG. 1A is a schematic diagram of an exemplary bulk acoustic wave (BAW) device.
Figure 1B:
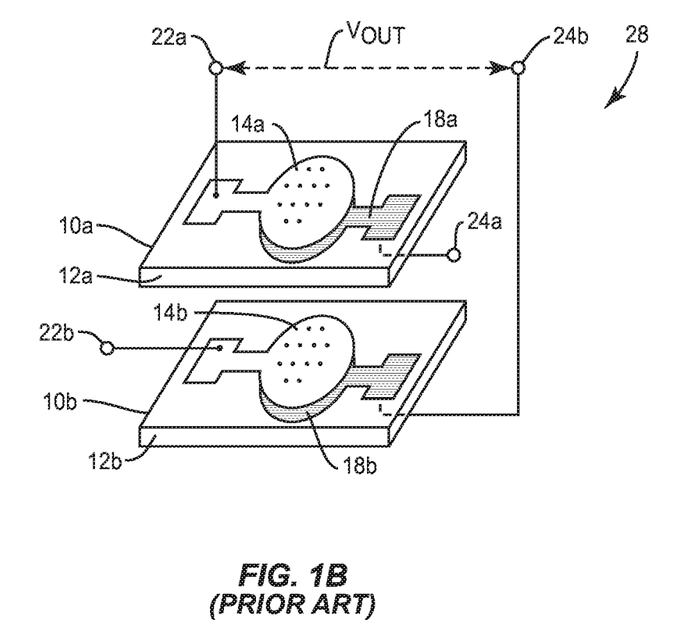
FIG. 1B is a schematic diagram of an exemplary BAW structure, which may be formed based on the BAW device of FIG. 1A.

Before discussing a wire-based MEMS apparatus of the present disclosure, a brief overview of a bulk acoustic wave (BAW) structure, which may multiply an RF voltage to generate a boosted RF voltage, is first provided with reference to FIGS. 1A and 1B. The discussion of specific exemplary aspects of the wire-based MEMS apparatus of the present disclosure starts below with reference to FIG. 2.

In this regard, FIG. 1A is a schematic diagram of an exemplary BAW device 10 (e.g., a BAW filter). The BAW device 10 includes a piezo layer 12 (e.g., a quartz crystal), a top metal electrode 14 disposed on a top surface 16 of the piezo layer 12, and a bottom metal electrode 18 disposed on a bottom surface 20 of the piezo layer 12. When a voltage $V_{IN}$ is applied between a top electrical port 22 and a bottom electrical port 24, an acoustic wave 26 is excited and resonates at a resonance frequency $f_C$ between the top surface 16 and the bottom surface 20 of the piezo layer 12. The resonance frequency $f_C$ may be determined by a thickness of the piezo layer 12 as well as a mass of the top metal electrode 14 and the bottom metal electrode 18.

The BAW device 10 may be configured to expand the piezo layer 12 when a positive voltage $V_{IN}$ is applied between the top electrical port 22 and the bottom electrical port 24 and compresses the piezo layer 12 when a negative voltage $V_{IN}$ is applied between the top electrical port 22 and the bottom electrical port 24. Hereinafter, the BAW device 10 in which the piezo layer 12 expands and compresses respectively in response to the positive voltage $V_{IN}$ and the negative voltage $V_{IN}$ is referred to as a polarized BAW device 10a.

Alternatively, the BAW device 10 may be configured to compress the piezo layer 12 when the positive voltage $V_{IN}$ is applied between the top electrical port 22 and the bottom electrical port 24 and expand the piezo layer 12 when the negative voltage $V_{IN}$ is applied between the top electrical port 22 and the bottom electrical port 24. Hereinafter, the BAW device 10 in which the piezo layer 12 compresses and expands respectively in response to the positive voltage $V_{IN}$ and the negative voltage $V_{IN}$ is referred to as a polarized inverted BAW device 10b.

FIG. 1B is a schematic diagram of an exemplary BAW structure 28, which may be formed based on the polarized BAW device 10a (e.g., a polarized BAW filter) and the polarized inverted BAW device 10b (e.g., a polarized inverted BAW filter) of FIG. 1A. Common elements between FIGS. 1A and 1B are shown therein with common element numbers and will not be re-described herein.

The polarized BAW device 10a includes a piezo layer 12a (e.g., a quartz crystal), a top metal electrode 14a, and a bottom metal electrode 18a that correspond to the piezo layer 12, the top metal electrode 14, and the bottom metal electrode 18 of FIG. 1A, respectively. The polarized inverted BAW device 10b includes a piezo layer 12b (e.g., a quartz crystal), a top metal electrode 14b, and a bottom metal electrode 18b that correspond to the piezo layer 12, the top metal electrode 14, and the bottom metal electrode 18 of FIG. 1A, respectively. In a non-limiting example, the polarized BAW device 10a is stacked on top of the polarized inverted BAW device 10b. In this regard, the bottom metal electrode 18a of the polarized BAW device 10a is coupled to the top metal electrode 14b of the polarized inverted BAW device 10b.

When the positive voltage $V_{IN}$ is applied between the top metal electrode 14a and the bottom metal electrode 18a, the piezo layer 12a expands. Concurrently, when the positive voltage $V_{IN}$ is applied between the top metal electrode 14b and the bottom metal electrode 18b, the piezo layer 12b compresses. As a result, a voltage $V_{OUT}$ between the top metal electrode 14a and the bottom metal electrode 18b equals two times the voltage $V_{IN}$ ($V_{OUT}=2 \times V_{IN}$). In this regard, the BAW structure 28 can be said to function as a voltage multiplier. Accordingly, by interleaving an equal number of the polarized BAW device 10a and the polarized inverted BAW device 1b in a BAW structure, it may be possible to multiply the voltage $V_{IN}$ to generate the voltage $V_{OUT}$ based on the equation (Eq. 1) below.

$$V_{OUT}=N_L \times V_{IN} \qquad (Eq. 1)$$

In the equation (Eq. 1) above, $N_L$ represents a total number of the polarized BAW device 10a and the polarized inverted BAW device 10b in the BAW structure 28. For example, if the BAW structure 28 is configured to include five (5) polarized BAW devices 10a that interleave with 5 polarized inverted BAW devices 10b, the BAW structure 28 is able to generate the voltage $V_{OUT}$ that equals ten (10) times the voltage $V_{IN}$ ($V_{OUT}=10 \times V_{IN}$). As discussed below, the BAW structure 28 may be provided in a passive MEMS switch circuit to generate a boosted RF voltage (e.g., $V_{OUT}$) based on an RF voltage (e.g., $V_{IN}$) for controlling a MEMS switch(es).

Figure 2:
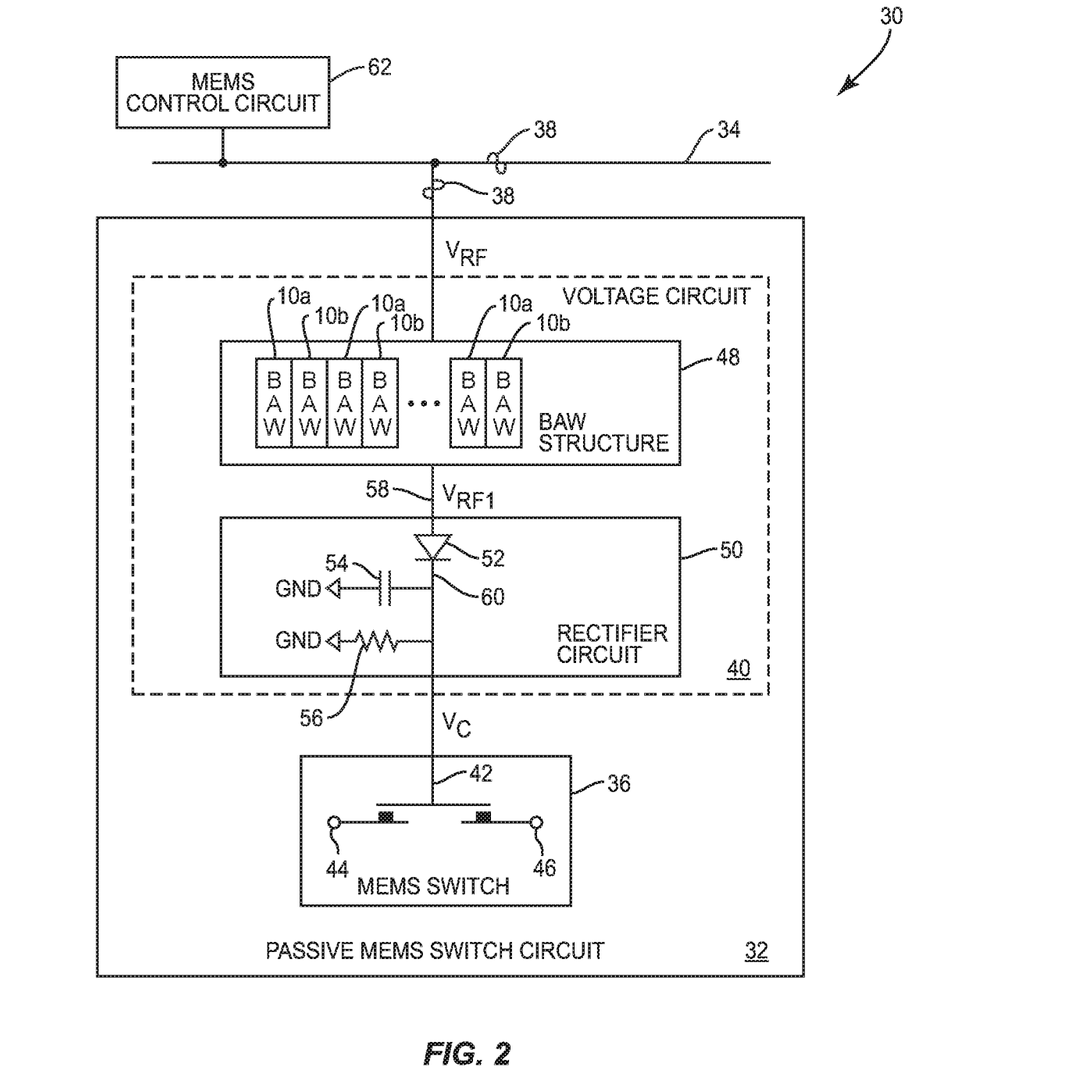
FIG. 2 is a schematic diagram of an exemplary wire-based microelectromechanical systems (MEMS) apparatus that includes at least one passive MEMS switch circuit coupled to a MEMS control bus and configured to generate a constant voltage for closing a MEMS switch based on a radio frequency (RF) voltage provided by an RF signal received via the MEMS control bus.

FIG. 2 is a schematic diagram of an exemplary wire-based MEMS apparatus 30 that includes at least one passive MEMS switch circuit 32 coupled to a MEMS control bus 34 and configured to generate a constant voltage $V_C$ for closing a MEMS switch 36 based on an RF voltage $V_{RF}$ provided by an RF signal 38 received via the MEMS control bus 34. In a non-limiting example, the MEMS control bus 34 is a wired bus consisting of a single wire.

As discussed in detail below, the passive MEMS switch circuit 32 can be configured to multiply the RF voltage $V_{RF}$ to generate a boosted RF voltage $V_{RF1}$, which is higher than the RF voltage $V_{RF}$, and subsequently generate the constant voltage $V_C$ based on the boosted RF voltage $V_{RF1}$ to close the MEMS switch 36. In this regard, there will be no electrical current in the passive MEMS switch circuit 32 until the RF signal 38 is received. As such, the passive MEMS switch circuit 32 has very little leakage in absence of the RF signal 38, thus making it possible to provide the passive MEMS switch circuit 32 in a low power apparatus (e.g., a battery-operated electronic device) for supporting such applications as the Internet-of-Things (IoT).

In a non-limiting example, the passive MEMS switch circuit 32 includes a voltage circuit 40 configured to generate the constant voltage $V_C$ based on the RF voltage $V_{RF}$. The MEMS switch 36 includes a gate terminal 42 that is coupled to the voltage circuit 40 to receive the constant voltage $V_C$. When the constant voltage $V_C$ exceeds (higher than or equal to) a defined threshold voltage (e.g., 30-50 V), the MEMS switch 36 is closed to allow an electrical current to flow from a drain terminal 44 to a source terminal 46, or vice versa. In contrast, when the constant voltage $V_C$ is below the defined threshold voltage, the MEMS switch 36 is opened, thus stopping the electrical current between the drain terminal 44 and the source terminal 46.

The voltage circuit 40 is coupled to the MEMS control bus 34 to receive the RF signal 38, which is modulated to provide the RF voltage $V_{RF}$ in at least one frequency bandwidth $f_{BW}$. Herein, the phrase "frequency bandwidth" refers to a continuous RF band centered at a center frequency $f_C$ bounded by a lower frequency $f_L$ (lower than the center frequency $f_C$) and an upper frequency $f_U$ (higher than the center frequency $f_C$). In this regard, the frequency bandwidth $f_{BW}$ equals a differential between the upper frequency $f_U$ and the lower frequency $f_L$ ($f_{BW}=f_U-f_L$).

The voltage circuit 40 includes a BAW structure 48 configured to multiply the RF voltage $V_{RF}$ to generate the boosted RF voltage $V_{RF1}$. In a non-limiting example, the BAW structure 48 is identical to the BAW structure 28 of FIG. 1B. In this regard, the BAW structure 48 may include an equal number of polarized BAW devices 10a (e.g., polarized BAW filters) and polarized inverted BAW devices 10b (e.g., polarized inverted BAW filters). The polarized BAW devices 10a are configured to interleave with the polarized inverted BAW devices 10b. Accordingly, the BAW structure 48 may be able to multiply the RF voltage $V_{RF}$ to generate the constant voltage $V_C$ based on a total number of the polarized BAW device 10a and the polarized inverted BAW device 10b included in the BAW structure 48, as expressed in the equation (Eq. 1) above.

The BAW structure 48 may be so configured to pass the RF signal 38 in the frequency bandwidth $f_{BW}$, while rejecting the RF signal 38 outside the frequency bandwidth $f_{BW}$. As such, the passive MEMS switch circuit 32 can be configured to respond only if the RF signal 38 falls within the frequency bandwidth $f_{BW}$. In this regard, the RF signal 38 can be considered as being "absent" with respect to the passive MEMS switch circuit 32 when the RF signal 38 falls outside the frequency bandwidth $f_{BW}$, regardless of whether the RF signal 38 is present on the MEMS control bus 34. Accordingly, the voltage circuit 40 may not generate the constant voltage $V_C$ in absence of the RF signal 38. Hence, the passive MEMS switch circuit 32 may be said to be associated with and/or corresponding to the frequency bandwidth $f_{BW}$.

The voltage circuit 40 includes a rectifier circuit 50 configured to convert the boosted RF voltage $V_{RF1}$ to the constant voltage $V_C$. In a non-limiting example, the rectifier circuit 50 includes a diode 52, a holding capacitor 54, and a pull-down resistor 56. The diode 52 includes an anode node 58 coupled to the BAW structure 48 and a cathode node 60 coupled to the gate terminal 42. The diode 52 may be configured to convert the boosted RF voltage $V_{RF1}$ to the constant voltage $V_C$. The holding capacitor 54 is coupled between the cathode node 60 and a ground (denoted as GND). The holding capacitor 54 may be configured to smooth the constant voltage $V_C$ (e.g., remove ripples in the constant voltage $V_C$). The pull-down resistor 56 is coupled in parallel to the holding capacitor 54 between the cathode node 60 and the GND. In a non-limiting example, the pull-down resistor 56 is configured to pull the constant voltage $V_C$ to below the defined threshold voltage (e.g., the GND), thus keeping the MEMS switch 36 open, in absence of the RF signal 38.

The wire-based MEMS apparatus 30 can be configured to include a MEMS control circuit 62, which can be implemented by a field-programmable gate array (FPGA), as an example. In a non-limiting example, the MEMS control bus 34 is configured to operate based on a master-slave topology. In this regard, the MEMS control circuit 62 and the passive MEMS switch circuit 32 may be configured to operate as a master and a slave, respectively, based on the MEMS control bus 34. Accordingly, the MEMS control circuit 62 may be configured to modulate the RF signal 38 to provide the RF voltage $V_{RF}$ in the frequency bandwidth $f_{BW}$. In a non-limiting example, the MEMS control circuit 62 can be configured to amplitude modulate the RF signal 38 to the RF voltage $V_{RF}$ in the frequency bandwidth $f_{BW}$. The MEMS control circuit 62 can then communicate the RF signal 38 to the passive MEMS switch circuit 32 via the MEMS control bus 34.

Figure 3:
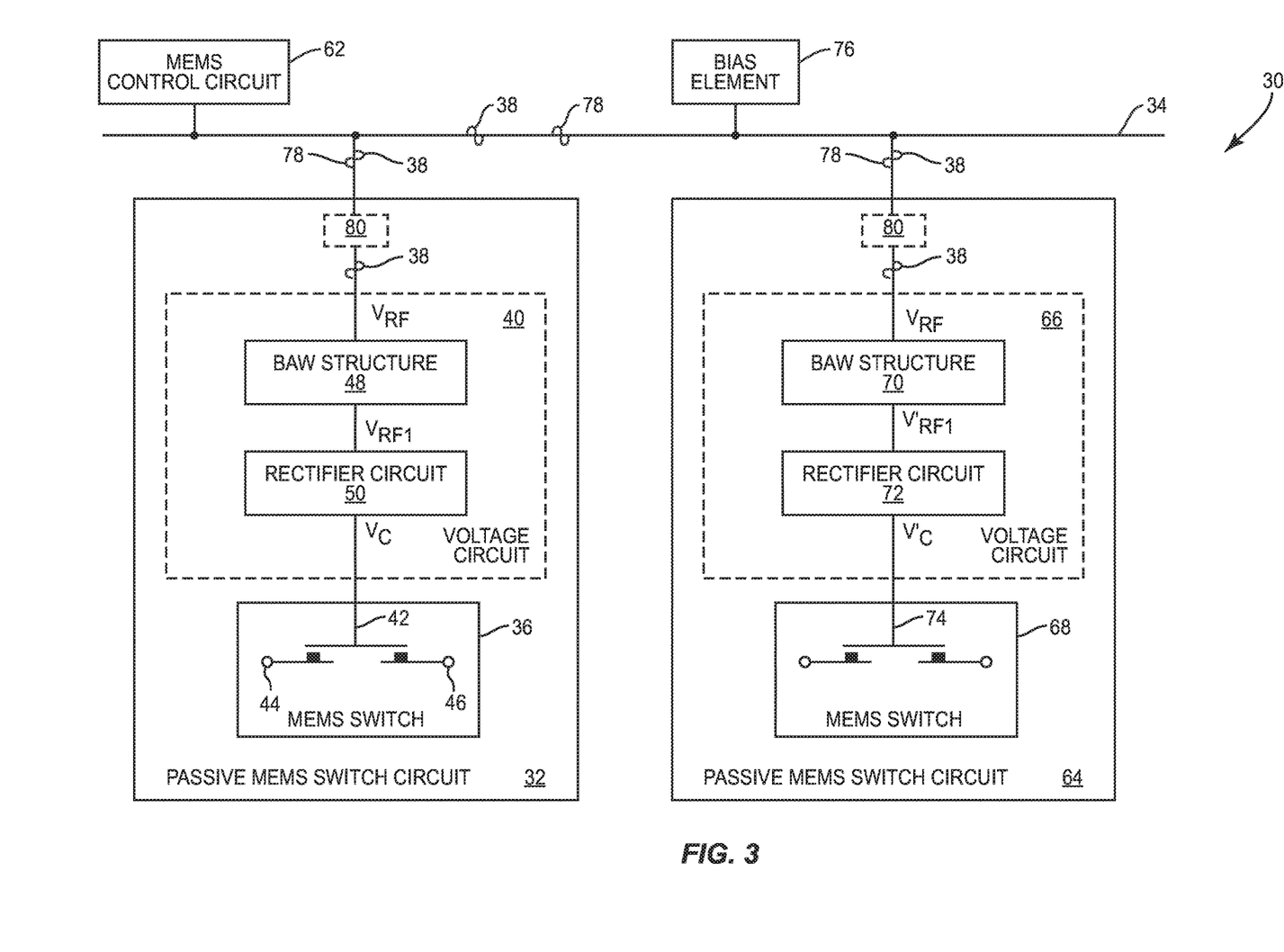
FIG. 3 is a schematic diagram providing an exemplary illustration of the wire-based MEMS apparatus of FIG. 2 configured to support at least one second passive MEMS switch circuit based on the MEMS control bus.

The wire-based MEMS apparatus 30 can be configured to support additional passive MEMS switch circuits based on the MEMS control bus 34. In this regard, FIG. 3 is a schematic diagram providing an exemplary illustration of the wire-based MEMS apparatus 30 of FIG. 2 configured to support at least one second passive MEMS switch circuit 64 based on the MEMS control bus 34. Common elements between FIGS. 2 and 3 are shown therein with common element numbers and will not be re-described herein.

The second passive MEMS switch circuit 64 is coupled to the MEMS control bus 34 and configured to operate as a slave to the MEMS control circuit 62. Like the passive MEMS switch circuit 32, the second passive MEMS switch circuit 64 includes a second voltage circuit 66 and a second MEMS switch 68. The second voltage circuit 66 includes a second BAW structure 70 and a second rectifier circuit 72, which may be identical to the BAW structure 48 and the rectifier circuit 50, respectively. In this regard, the second BAW structure 70 is configured to generate a second boosted RF voltage $V'_{RF1}$ based on the RF voltage $V_{RF}$ received from the RF signal 38. The second rectifier circuit 72 is configured to convert the second boosted RF voltage $V'_{RF1}$ into a second constant voltage $V'_C$. The second MEMS switch 68, which can be identical to the MEMS switch 36, has a respective gate terminal 74 coupled to the second rectifier circuit 72 to receive the second constant voltage $V'_C$ and can be closed when the second constant voltage $V'_C$ exceeds the defined threshold voltage (e.g., 30-50 V).

The second BAW structure 70 may be so configured to pass the RF signal 38 in at least one second frequency bandwidth $f'_{BW}$, while rejecting the RF signal 38 outside the second frequency bandwidth $f'_{BW}$. Similar to the frequency bandwidth $f_{BW}$, the second frequency bandwidth $f'_{BW}$ refers to a second continuous RF band centered at a second center frequency $f'_C$ bounded by a second lower frequency $f'_L$ (lower than the second center frequency $f'_C$) and a second upper frequency $f'_U$ (higher than the second center frequency $f'_C$). In this regard, the second frequency bandwidth $f'_{BW}$ equals a differential between the second upper frequency $f'_U$ and the second lower frequency $f'_L$ ($f'_{BW}=f'_U-f'_L$).

Like the passive MEMS switch circuit 32, the second passive MEMS switch circuit 64 can be configured to respond only if the RF signal 38 falls within the second frequency bandwidth $f'_{BW}$. In this regard, the RF signal 38 can be considered as being "absent" with respect to the second passive MEMS switch circuit 64 when the RF signal 38 falls outside the second frequency bandwidth $f'_{BW}$, regardless of whether the RF signal 38 is present on the MEMS control bus 34. Accordingly, the second voltage circuit 66 may not generate the second constant voltage $V'_C$ in absence of the RF signal 38. Hence, the second passive MEMS switch circuit 64 may be said to be associated with and/or corresponding to the second frequency bandwidth $f'_{BW}$.

Figure 4:
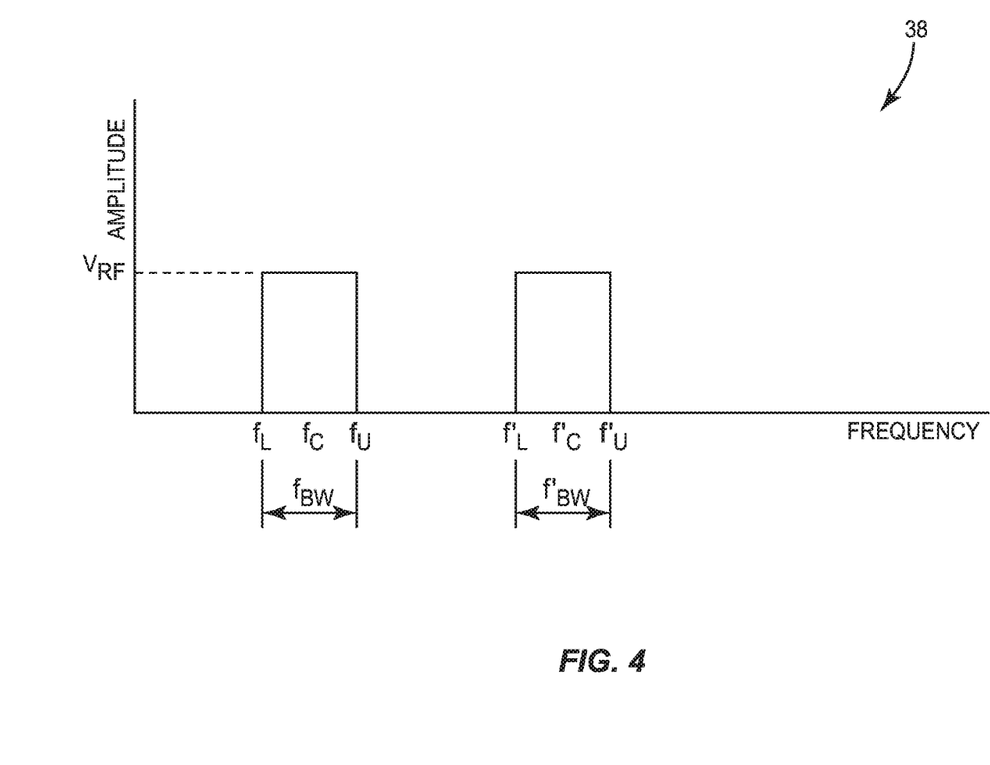
FIG. 4 is a graphic diagram providing an exemplary illustration of the RF signal in FIG. 2 modulated to provide the RF voltage in one or more non-overlapping frequency bandwidths.

To be able to selectively close any of the MEMS switch 36 and the second MEMS switch 68, the MEMS control circuit 62 may be configured to modulate the RF signal 38 to provide the RF voltage $V_{RF}$ in the frequency bandwidth $f_{BW}$ and the second frequency bandwidth $f'_{BW}$ that does not overlap with the frequency bandwidth $f_{BW}$. In this regard, FIG. 4 is a graphic diagram providing an exemplary illustration of the RF signal 38 in FIGS. 2 and 3 modulated to provide the RF voltage $V_{RF}$ in the frequency bandwidth $f_{BW}$ and/or the second frequency bandwidth $f'_{BW}$.

In a non-limiting example, the RF signal 38 is amplitude modulated to provide the RF voltage $V_{RF}$ in the frequency bandwidth $f_{BW}$ and the second frequency bandwidth $f'_{BW}$. As shown in FIG. 4, the frequency bandwidth $f_{BW}$ does not overlap with the second frequency bandwidth $f'_{BW}$ (e.g., $f_L \geq f'_U$). In this regard, the voltage circuit 40 and the second voltage circuit 66 can generate the constant voltage $V_C$ and the second constant voltage $V'_C$, respectively, based on the RF voltage $V_{RF}$. However, it should be appreciated that the MEMS control circuit 62 can cause the MEMS switch 36 or the second MEMS switch 68 to be closed by modulating the RF signal 38 to provide the RF voltage $V_{RF}$ in the frequency bandwidth $f_{BW}$ or the second frequency bandwidth $f'_{BW}$.

It should also be appreciated that the wire-based MEMS apparatus 30 can be configured to support additional passive MEMS switch circuits via the MEMS control bus 34. In this regard, the MEMS control circuit 62 can be configured to modulate the RF signal 38 to provide the RF voltage $V_{RF}$ in additional non-overlapping frequency bandwidths.

In addition, the MEMS control circuit 62 can be further configured to drive at least one BIAS element 76 that may not include a MEMS switch. For example, the MEMS control bus 62 can be configured to multiplex a communication signal 78 with the RF signal 38 for communication over the MEMS control bus 34. In this regard, each of the passive MEMS switch circuit 32 and the second passive MEMS switch circuit 64 may include a diplexer 80 for separating the RF signal 38 from the communication signal 78.

Those skilled in the art will recognize improvements and modifications to the embodiments of the present disclosure. All such improvements and modifications are considered within the scope of the concepts disclosed herein and the claims that follow.

What is claimed is:

1. A wire-based microelectromechanical systems (MEMS) apparatus comprising:
   a MEMS control bus configured to communicate a radio frequency (RF) signal modulated to provide an RF voltage in at least one frequency bandwidth; and
   at least one passive MEMS switch circuit coupled to the MEMS control bus and comprising:
      a voltage circuit corresponding to the at least one frequency bandwidth and configured to generate a constant voltage based on the RF voltage; and
      a MEMS switch coupled to the voltage circuit and configured to be closed in response to receiving the constant voltage exceeding a defined threshold voltage.

2. The wire-based MEMS apparatus of claim 1 wherein the MEMS control bus is configured to consist of one wire.

3. The wire-based MEMS apparatus of claim 1 further comprising a MEMS control circuit coupled to the MEMS control bus and configured to:
modulate the RF signal to provide the RF voltage in the at least one frequency bandwidth; and
communicate the RF signal to the at least one passive MEMS switch circuit via the MEMS control bus.

4. The wire-based MEMS apparatus of claim 3 wherein the MEMS control circuit is further configured to amplitude modulate the RF signal to provide the RF voltage in the at least one frequency bandwidth.

5. The wire-based MEMS apparatus of claim 3 further comprising at least one second passive MEMS switch circuit comprising:
a second voltage circuit corresponding to at least one second frequency bandwidth and configured to generate a second constant voltage based on the RF voltage; and
a second MEMS switch coupled to the second voltage circuit and configured to be closed in response to receiving the second constant voltage exceeding the defined threshold voltage.

6. The wire-based MEMS apparatus of claim 5 wherein the MEMS control circuit is further configured to:
modulate the RF signal to provide the RF voltage in the at least one second frequency bandwidth non-overlapping with the at least one frequency bandwidth; and
communicate the RF signal to the at least one second passive MEMS switch circuit via the MEMS control bus.

7. The wire-based MEMS apparatus of claim 6 wherein:
the MEMS control circuit is further configured to operate as a master on the MEMS control bus; and
the at least one passive MEMS switch circuit and the at least one second passive MEMS switch circuit are configured to operate as slaves on the MEMS control bus.

8. The wire-based MEMS apparatus of claim 1 wherein the voltage circuit comprises:
a bulk acoustic wave (BAW) structure coupled to the MEMS control bus and configured to resonate at the at least one frequency bandwidth to convert the RF voltage to a boosted RF voltage higher than the RF voltage; and
a rectifier circuit coupled to the BAW structure and configured to generate the constant voltage based on the boosted RF voltage.

9. The wire-based MEMS apparatus of claim 8 wherein the BAW structure is further configured to block the RF signal outside the at least one frequency bandwidth such that the BAW structure does not convert the RF voltage to the boosted RF voltage and the rectifier circuit does not generate the constant voltage.

10. The wire-based MEMS apparatus of claim 9 wherein the rectifier circuit comprises:
a diode having an anode coupled to the BAW structure and a cathode node coupled to a gate terminal of the MEMS switch, the diode configured to generate the constant voltage based on the boosted RF voltage in response to the BAW structure generating the boosted RF voltage; and
a holding capacitor coupled between the cathode node and a ground, the holding capacitor configured to smooth the constant voltage.

11. The wire-based MEMS apparatus of claim 10 wherein the rectifier circuit further comprises a pull-down resistor coupled in parallel to the holding capacitor between the cathode node and the ground and configured to pull the constant voltage down to the ground in response to the BAW structure not generating the boosted RF voltage.

12. The wire-based MEMS apparatus of claim 8 wherein the BAW structure is configured to include an equal number of interleaving polarized BAW devices and polarized inverted BAW devices determined based on the boosted RF voltage.

13. A wire-based microelectromechanical systems (MEMS) apparatus comprising:
a MEMS control bus configured to communicate a radio frequency (RF) signal modulated to provide an RF voltage in at least one frequency bandwidth;
a MEMS control circuit coupled to the MEMS control bus and configured to:
modulate the RF signal to provide the RF voltage in the at least one frequency bandwidth; and
communicate the RF signal via the MEMS control bus; and
at least one passive MEMS switch circuit coupled to the MEMS control bus and comprising:
a voltage circuit corresponding to the at least one frequency bandwidth and configured to generate a constant voltage based on the RF voltage; and
a MEMS switch coupled to the voltage circuit and configured to be closed in response to receiving the constant voltage exceeding a defined threshold voltage.

14. The wire-based MEMS apparatus of claim 13 wherein the MEMS control bus is configured to consist of one wire.

15. The wire-based MEMS apparatus of claim 13 wherein the MEMS control circuit is further configured to amplitude modulate the RF signal to provide the RF voltage in the at least one frequency bandwidth.

16. The wire-based MEMS apparatus of claim 13 wherein the voltage circuit comprises:
a bulk acoustic wave (BAW) structure coupled to the MEMS control bus and configured to resonate at the at least one frequency bandwidth to convert the RF voltage to a boosted RF voltage higher than the RF voltage; and
a rectifier circuit coupled to the BAW structure and configured to generate the constant voltage based on the boosted RF voltage.

17. The wire-based MEMS apparatus of claim 16 wherein the BAW structure is further configured to block the RF signal outside the at least one frequency bandwidth such that the BAW structure does not convert the RF voltage to the boosted RF voltage and the rectifier circuit does not generate the constant voltage.

18. The wire-based MEMS apparatus of claim 17 wherein the rectifier circuit comprises:
a diode having an anode coupled to the BAW structure and a cathode node coupled to a gate terminal of the MEMS switch, the diode configured to generate the constant voltage based on the boosted RF voltage in response to the BAW structure generating the boosted RF voltage; and
a holding capacitor coupled between the cathode node and a ground, the holding capacitor configured to smooth the constant voltage.

19. The wire-based MEMS apparatus of claim 18 wherein the rectifier circuit further comprises a pull-down resistor coupled in parallel to the holding capacitor between the cathode node and the ground and configured to pull the constant voltage down to the ground in response to the BAW structure not generating the boosted RF voltage.

20. The wire-based MEMS apparatus of claim 16 wherein the BAW structure is configured to include an equal number of interleaving polarized BAW devices and polarized inverted BAW devices determined based on the boosted RF voltage.

* * * * *